United States Patent [19]

Monahan

[11] Patent Number: 5,302,828
[45] Date of Patent: Apr. 12, 1994

[54] SCANNING TECHNIQUES IN PARTICLE BEAM DEVICES FOR REDUCING THE EFFECTS OF SURFACE CHARGE ACCUMULATION

[75] Inventor: Kevin M. Monahan, Cupertino, Calif.

[73] Assignee: Metrologix Corporation, Santa Clara, Calif.

[21] Appl. No.: 984,932

[22] Filed: Dec. 3, 1992

[51] Int. Cl.$^5$ .............................................. H01J 37/28
[52] U.S. Cl. .................................. 250/307; 313/361.1
[58] Field of Search ............... 250/307, 310, 309, 398; 313/361.1

[56] References Cited

U.S. PATENT DOCUMENTS 4,791,294  12/1988  Furuya ................................. 250/307
4,839,520  6/1989  Garth ................................... 250/310

OTHER PUBLICATIONS

"Metrologix E-Beam Metrology", Product Brochure, Metrologix, Dec. 3, 1991.

"Charging Effects in Low-Voltage SEM Metrology" K. M. Monahan, J. P. H. Benschop, T. A. Harris, Proceedings Reprint by the Society of Photo-Optical Instrumentation Engineers, 1991.

*Primary Examiner*—Bruce C. Anderson
*Attorney, Agent, or Firm*—Burns, Doane, Swecker & Mathis

[57] ABSTRACT

Improved scanning methods for use in a scanning particle beam microscop reduce the effects of surface charge accumulation, increasing linearity and precision. More particularly, signal distortion is reduced by scanning across an object along a line in a first direction to produce a first signal, scanning across the object along the identical line in an opposite, anti-parallel, direction to produce a second signal, and combining the first and second signals. This technique is referred to as scan reversal. Baseline drift is substantially canceled out of the resulting signal. According to another technique imaging of a general circular high-aspect-ratio structure is enhanced by identifying approximately the center of the structure, electrostatically scanning a particle beam along a multiplicity of radii of the structure, detecting particles emitted from the surface of the structure being examined to generate a detection signal, and using the detection signal to form an enhanced image of the generally circular high-aspect-ratio structure. This technique is referred to as radial scanning. According to a further technique, the effects of surface charging are reduced by identifying features of an object in a low magnification image and scanning a particle beam across the object discontinuously, only in portions of an image field containing the features of interest. The "background" of the image field is therefore not charged, improving imaging of the features of interest. This technique is referred to as structured scanning.

8 Claims, 5 Drawing Sheets

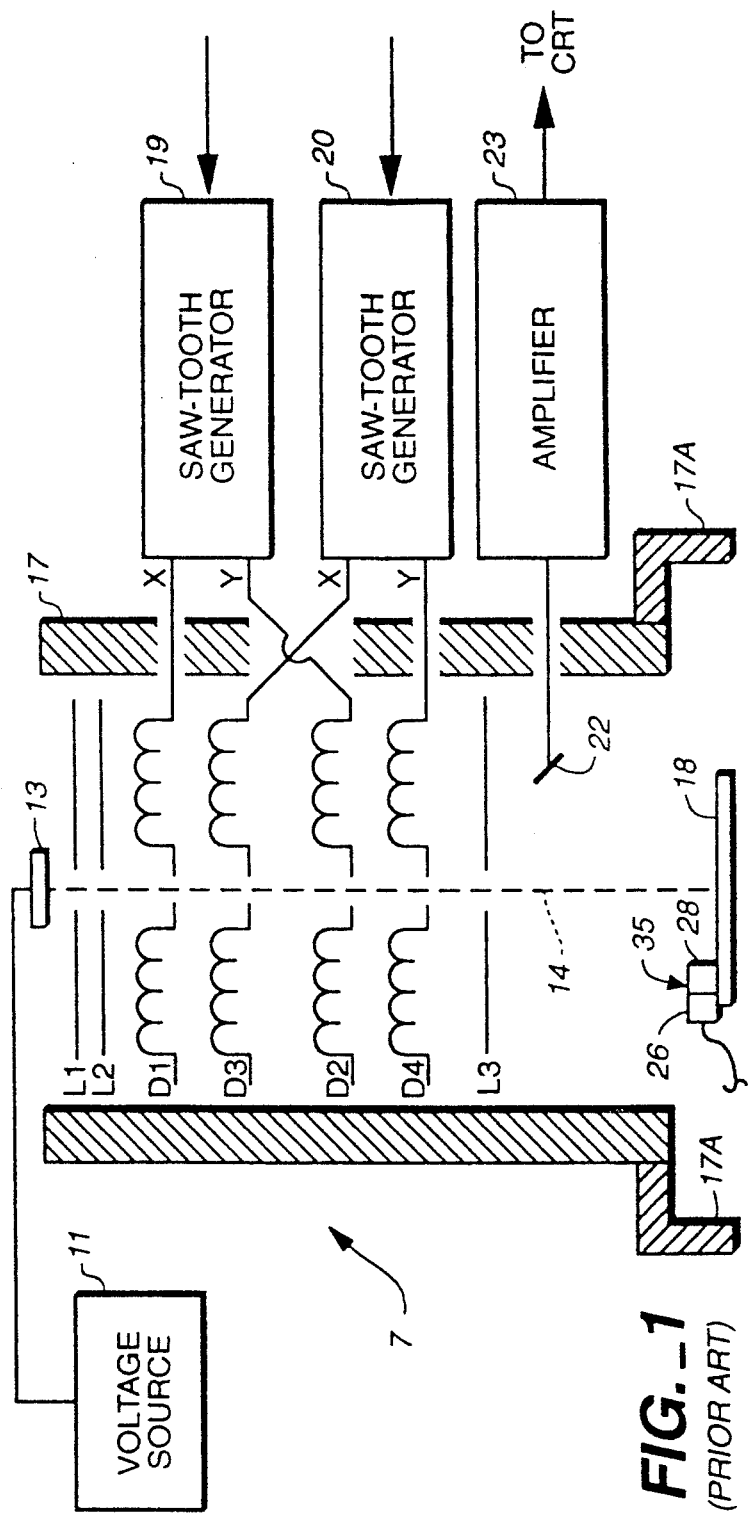
FIG._1
(PRIOR ART)

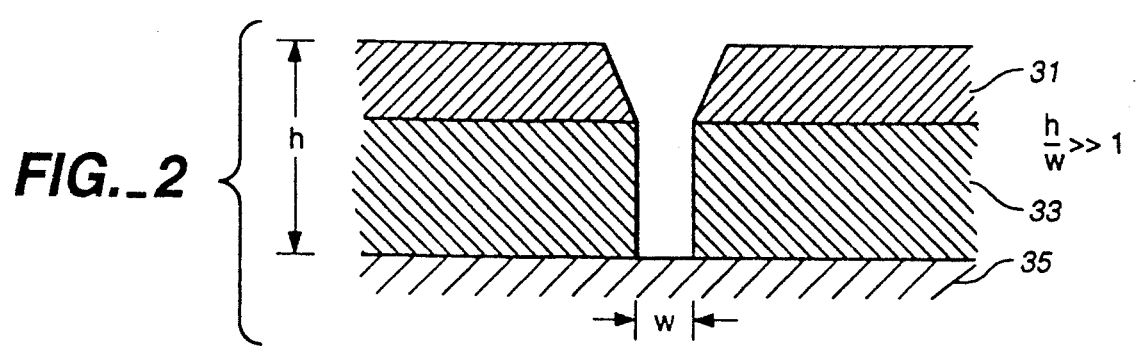
FIG._2
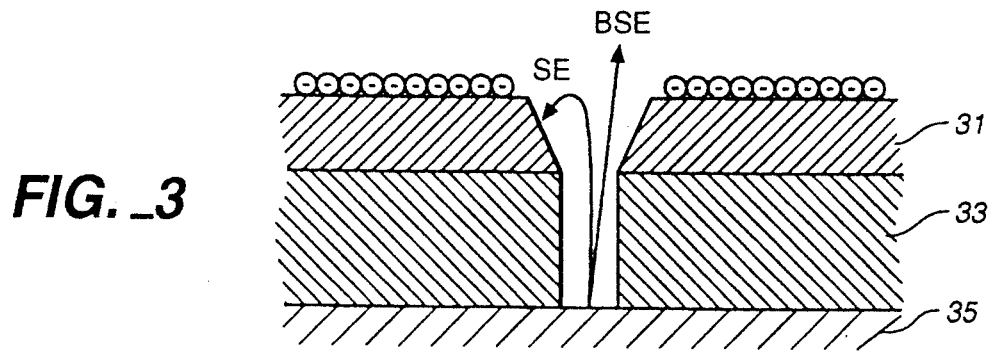
FIG._3
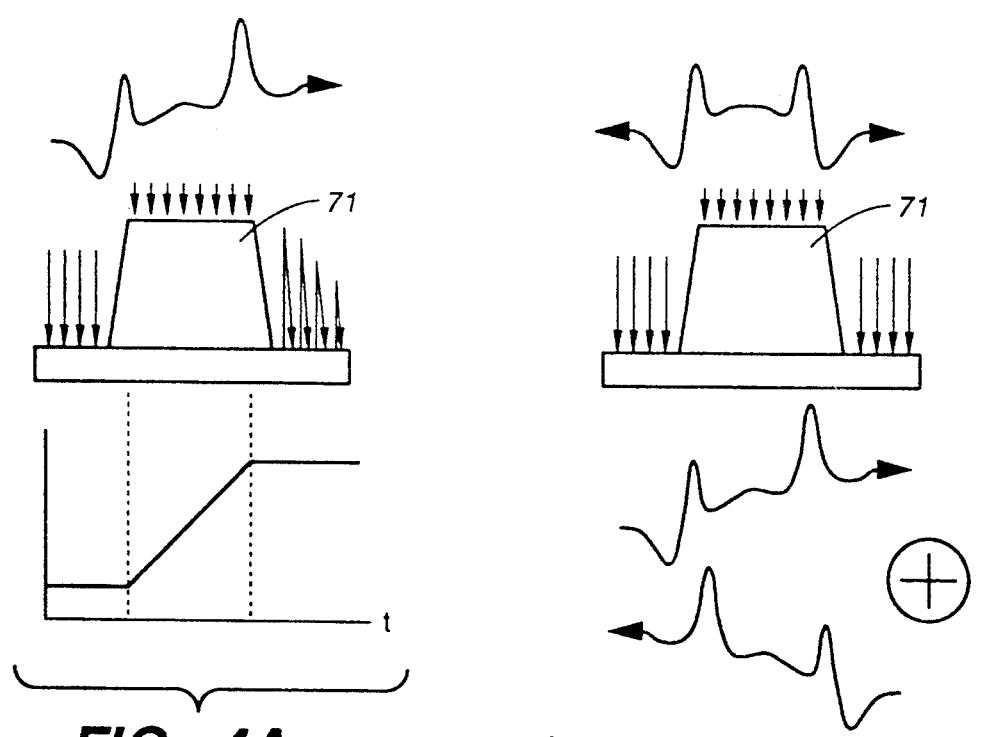
FIG._4A
(PRIOR ART)
FIG._4B

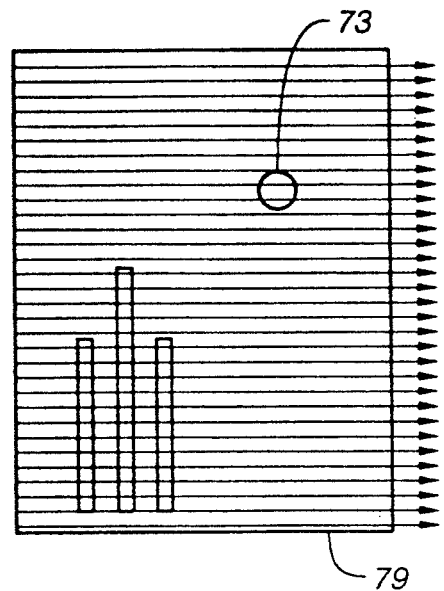
FIG._5A
(PRIOR ART)
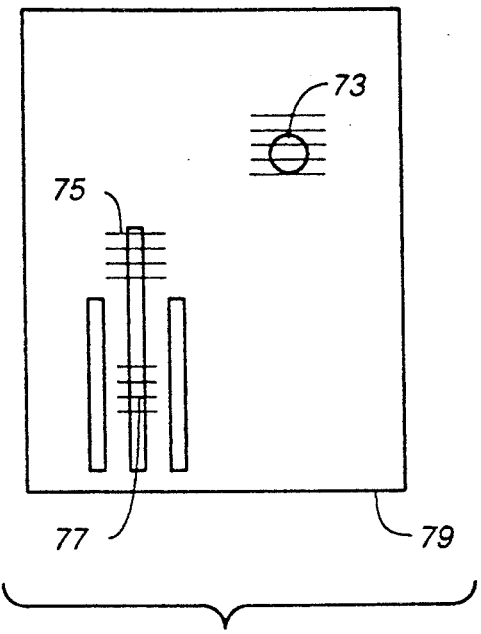
FIG._5B
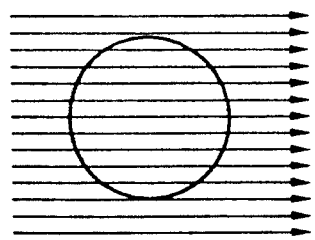
FIG._6A
(PRIOR ART)
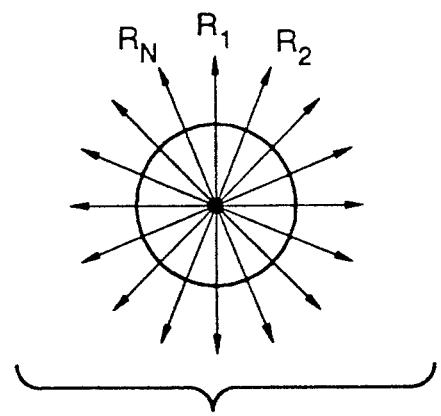
FIG._6B

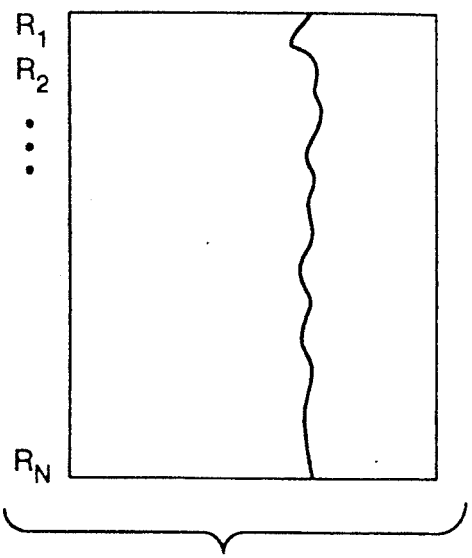
FIG._7
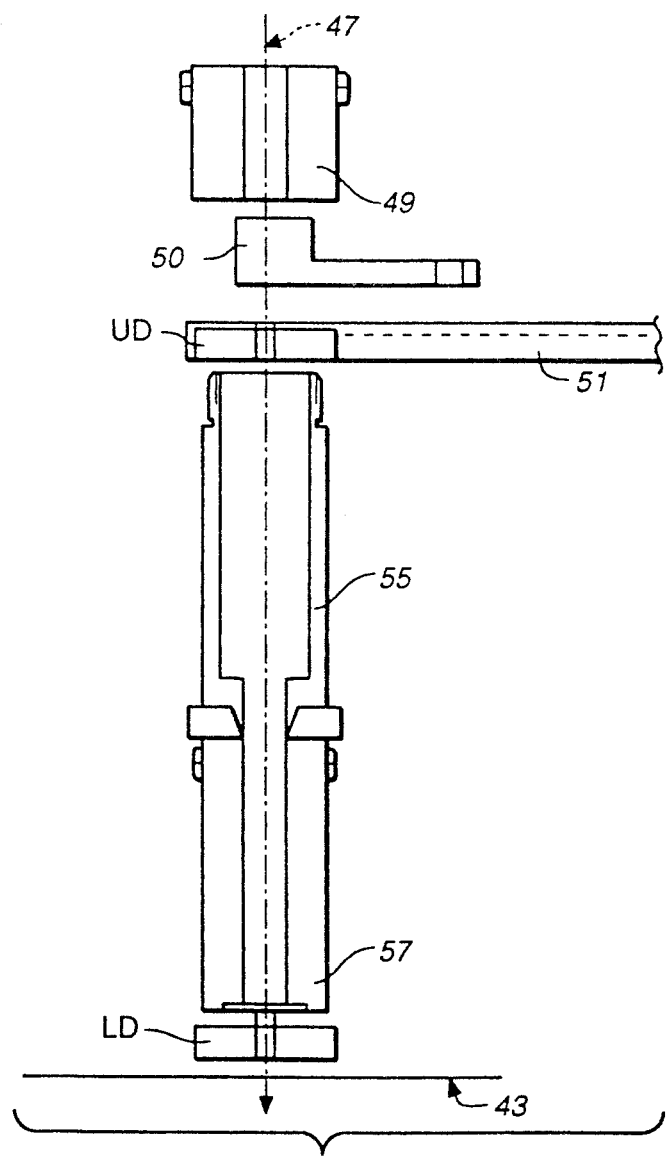
FIG._8

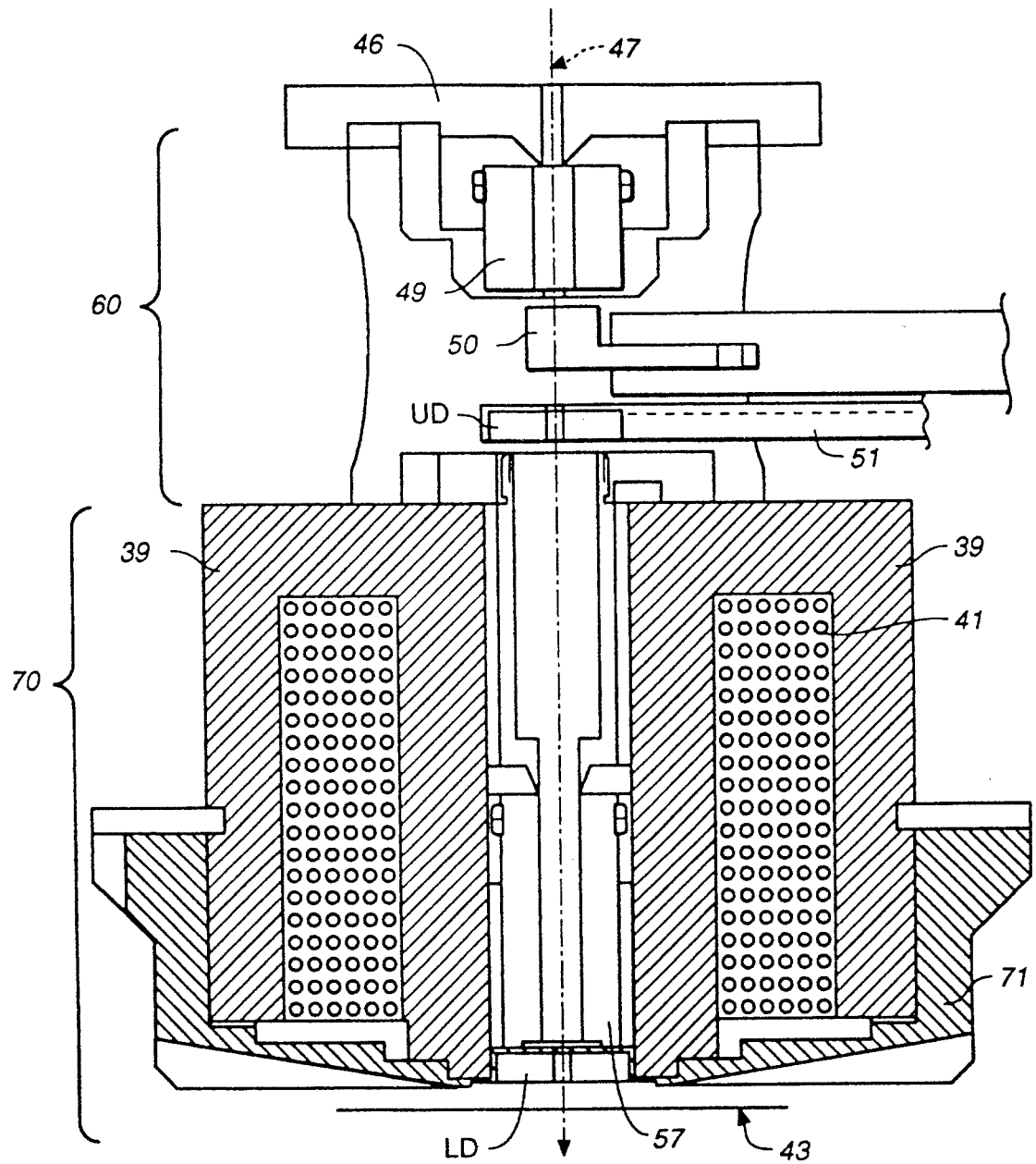
FIG._9

SCANNING TECHNIQUES IN PARTICLE BEAM DEVICES FOR REDUCING THE EFFECTS OF SURFACE CHARGE ACCUMULATION

BACKGROUND OF THE INVENTION

1. Field of the Invention

The present invention relates to particle beam metrology wherein a particle beam device such as a scanning electron microscope is used to perform critical dimension measurements of objects, for example integrated circuit wafers.

2. State of the Art

It is known to use electromagnetic systems in microscopes such as scanning electron microscopes (SEM) for measurement and inspection purposes. Scanning electron microscopes are often used in place of traditional optical microscopes for microelectronics inspection and metrology applications in semiconductor manufacturing. The metrology tools are often used, for example, for measuring patterns (i.e. critical dimensions) formed on semiconductor wafers during fabrication.

The short wavelengths of scanning electron microscopes have several advantages over conventionally used optical microscopes. For example, scanning electron microscopes can achieve resolutions from about 100 Å to 200 Å, while the limit of resolution of optical microscopes is typically about 2500 Å. Further, scanning electron microscopes provide depth of field several orders of magnitude greater than optical microscopes. Despite the accuracy and precision of present scanning electron microscopes, enhanced instrument specifications and capabilities are required as parameters (e.g. critical dimensions) to be inspected come within the sub-micrometer ranges.

An article entitled "Microelectronics Dimensional Metrology in the Scanning Electron Microscope", Parts I and II, *Solid State Technology*, by Michael T. Postek et al. (November 1986), describes a typical SEM wafer inspection system. As described therein, a focused electron beam is scanned from point to point on the specimen surface in a rectangular raster pattern. Accelerating voltage, beam current and spot diameter are optimized for the specific application and specimen composition.

As the scanning electron beam contacts the surface of the specimen, backscattered and/or secondary electrons are emitted from the specimen surface. Semiconductor inspection, analysis and metrology is performed by detecting the backscattered and/or secondary electrons. A point by point representation of the specimen is obtained on a CRT screen as the electron beam controllably scans the specimen.

Conventionally, a particle beam device such as a scanning electron microscope 7, shown in FIG. 1, includes a voltage source 11. The voltage source 11 is connected to an electron source 13 that directs a narrow beam of highly accelerated electrons towards a specimen stage 18 via a plurality of electron lenses $L_1$, $L_2$, and $L_3$. The electron beam is indicated by the dashed line 14. The electron beam may be focused onto a wafer stage of the scanning electron microscope using an autofocus technique.

As further shown in FIG. 1, a cylindrical column 17 houses the electron source 13 and the lenses $L_1$, $L_2$, and $L_3$. The column 17 is normally referred to as an electron optical column and includes a chamber, indicated in the drawing as 17A, that surrounds and supports a specimen stage 18. Together, the optical column 17 and the chamber 17A represent the body of the scanning electron microscope.

The scanning electron microscope 7 of FIG. 1 further includes an electrostatic deflection system for selectively scanning the electron beam across the specimen stage 18. The deflection system includes, for example, four pairs of electron beam scanning coils, designated $D_1$ through $D_4$. The scanning coils are located within optical column 17 for focusing the electron beam on the surface of the specimen held on stage 18. The pair of deflection coils $D_1$ and $D_2$ are connected to sawtooth voltage generator 19, and the pair of deflection coils $D_3$ and $D_4$ are connected to sawtooth voltage generator 20.

The electron beam scanning coils $D_1$ through $D_4$ deflect the electron beam 14 in two, generally perpendicular, directions. In the drawing, the deflection directions are designated as the x-direction and the y-direction, respectively. The x-direction and the y-direction typically are in a plane perpendicular to the direction of beam 14, but strict orthogonality is not required. For present purposes, it can be assumed that coils $D_1$ and $D_3$ deflect the scanning beam in the x-direction and that coils $D_2$ and $D_4$ deflect the scanning beam in the y-direction.

An electron collector 22 is arranged near the surface of a stage 18 which is exposed to beam 14. The electron collector is connected to an amplifier 23 which provides signals to an analog-to-digital converter 43 for transforming the collected electron current to digital signals which may be subsequently displayed on a video display 49.

In operation, saw-tooth generators 19 and 20 provide time-varying voltage signals to electron beam scanning coils $D_1$ and $D_4$ such that beam 14 is deflected across specimen stage 18 in a predetermined scanning pattern. The saw-tooth generators 19 and 20 typically operate synchronously to drive the electron beam across stage 18 in the x-direction at a constant rate, with each scan beam deflected in the y-direction to form a series of generally parallel scanning lines.

During operation of the FIG. 1 scanning electron microscope, collector 22 detects changes in the electron current at stage 18. Thus, as the electron beams scans a specimen on stage 18, changes in the composition, texture and topography of the specimen causing amplitude variations of the electron current detected by collector 22. With each complete scanning sequence, an image corresponding to features of the specimen can be created.

Traditional methods of electron imaging rely on secondary electron emission and, as a result, have limited capability for extracting information from the base of sub-micrometer contact holes and other high-aspect-ratio structures. Such a high-aspect-ratio contact hole is a common feature of semiconductor wafers and is shown in FIG. 2. A layer of resist 31 has been used to pattern a sub-micrometer contact hole in a layer of oxide 33 coated on the surface of a wafer 35. The height h of the contact hole is considerably greater than the width w of the contact hole such that $h/w \gg 1$. Typical values of h and w might be 2.0 µm and 0.5 µm respectively, giving an aspect ratio of 4:1.

The difficulty of imaging high-aspect-ratio structures using traditional methods of secondary electron imaging holds particularly true for structures with nearly vertical profiles. Because of the insulating properties of oxide and photoresist, directing a primary electron beam onto the wafer structure causes negative surface charge to accumulate at the surface of the photoresist layer as illustrated at FIG. 3. A few volts of surface potential can severely disturb the secondary electron image, since secondary electrons (SE) are typically emitted with energies less than 10 electron volts. In cases of severe charging, commonly encountered when imaging contact holes, secondary electron emission from the base may be shut off entirely. Attempts to control surface fields have been only partially effective and may themselves introduce artifacts by modulating the landing energy of the primary electron beam.

Charge accumulation on photoresist structures surrounding the features to be measured is a common cause of non-linearity and distortion not only in the case of contact holes but also in the case of photoresist lines and other features in general. Referring to FIG. 4A, as an electron beam is scanned across a photoresist line 71, charge accumulation on the surface of the photoresist line begins as the beam contacts the surface of the photoresist line and continues at a constant rate as the beam traverses the photoresist line such that, by the time the beam leaves the surface of the photoresist line, a significant amount of charge has accumulated, resulting in a baseline shift of the resulting signal.

Conventional scanning techniques have only contributed to the problem of charge accumulation. When a measurement is to be performed of a feature in an image field, conventionally, the entire image field is scanned. For example, referring to FIG. 5A, measurements may be required of the contact hole 73, the isolated line 75, and the dense line 77. Despite these features occupying only a portion of the image field 79, conventionally, the entire image field is scanned. As a result, scan accumulation occurs even in areas where no information is being generated, adversely affecting accuracy in those areas where information is being generated.

In the prior art, contact holes, as with other object features, have been raster scanned as shown in FIG. 6A. In addition to surface charging, raster scanning of contact holes has another significant drawback. To facilitate detection of the edge of the contact hole, the "attack angle" of the particle beam to the contact hole should ideally be perpendicular. In FIG. 6A, this ideal attack angle is approximated only near the horizontal radius of the contact hole. For scans above and below this medial line, the attack angle becomes smaller and smaller (and thus poorer and poorer) as the distance from the medial line increases. Edge detection therefore becomes difficult.

Accordingly, a need exists for improved imaging techniques for extracting information from the base of sub-micrometer contact holes and other high-aspect-ratio structures. A further need exists for methods of reducing the distortion effects of baseline drift during scanning of photoresist structures. In general, a need exists for improved scanning methods that reduce the deleterious effects of surface charge accumulation, improving precision and linearity.

SUMMARY OF THE INVENTION

The present invention, generally speaking, provides improved scanning methods for use in a scanning particle beam microscope. The improved scanning methods reduce the effects of surface charge accumulation, increasing linearity and precision. More particularly, in accordance with one embodiment of the invention, signal distortion is reduced by scanning across an object along a line in a first direction to produce a first signal, scanning across the object along the identical line in an opposite, anti-parallel, direction to produce a second signal, and combining the first and second signals. Baseline drift is substantially canceled out of the resulting signal. In another embodiment of the invention, imaging of a general circular high-aspect-ratio structure is enhanced by identifying approximately the center of the structure, electrostatically scanning a particle beam along a multiplicity of radii of the structure, detecting particles emitted from the surface of the structure being examined to generate a detection signal, and using the detection signal to form an enhanced image of the generally circular high-aspect-ratio structure. In a further embodiment of the invention, the effects of surface charging are reduced by identifying features of an object in a low magnification image and scanning a particle beam across the object discontinuously, only in portions of an image field containing the features of interest. The "background" of the image field is therefore not charged, improving imaging of the features of interest.

BRIEF DESCRIPTION OF THE DRAWINGS

The present invention may be further understood from the following written description in conjunction with the appended drawings. In the drawings:

FIG. 1 is a simplified diagram of a conventional scanning electron microscope;

FIG. 2 is a sectional view of a contact hole portion of a semiconductor wafer structure;

FIG. 3 is a sectional view like that of FIG. 2, showing the effects of surface charge accumulation;

FIG. 4A is a diagram illustrating baseline drift as a result of surface charge accumulation;

FIG. 4B is a diagram illustrating cancellation of baseline drift obtained from scan reversal;

FIG. 5A is a diagram illustrating a conventional method of scanning an image field;

FIG. 5B is a diagram illustrating structured scanning of selected features within the image field of 5A;

FIG. 6A is a diagram illustrating a conventional method of scanning a contact hole;

FIG. 6B is a diagram illustrating radial scanning of the contact hole;

FIG. 7 is a diagram representing an image produced by remapping the radial scans of FIG. 6B to a raster scan format;

FIG. 8 is a sectional view of an optical column of a scanning electron microscope with which the present invention may be used; and FIG. 9 is a sectional view showing in greater detail features of the electron optics of the scanning electron microscope of FIG. 8.

DETAILED DESCRIPTION OF THE PREFERRED EMBODIMENTS

Scanning techniques used with conventional scanning electron microscopes have been limited by the use of electromagnetic deflection of a type commonly used in CRTs. Electromagnetic deflection exhibits a hysteresis characteristic that prevents the beam position from being precisely controlled. The present scanning methods are designed to take advantage of hysteresis-free electrostatic scanning using a suitable electrostatic deflection device. One such device is known as an "octupole" and is incorporated in certain electron gun assemblies manufactured by FEI, Inc. An octupole may be most conveniently described as an octagonal barrel in which the sides are conductors and the vertices are insulators (possibly free space). Electrodes are connected to each are connected to each of the conductive plates, across which voltages are applied. The strength of a resulting electric field may be varied by varying the applied voltage, and the direction of the electric field may be varied by varying the voltages applied to different opposing pairs of conductive plates.

Using electrostatic scanning, the direction, length, distribution and repetition of scans can be independently controlled to virtually eliminate the feature-dependent linearlity error characteristic of prior art. One such feature-dependent linearity error is baseline drift, illustrated in FIG. 4A and described previously. Referring to FIG. 4B, hysteresis-free electrostatic scanning enables scan reversal to be performed, assuring a symmetrical image without the baseline distortion encountered in typical unidirectional scanning systems. During scan reversal, two unidirectional scans are performed that are coincident and anti-parallel. During each unidirectional scan, baseline drift is encountered. The baseline drift encountered in one unidirectional scan, however, is equal but opposite to the baseline drift encountered in the other unidirectional scan. Summing detected signals from the two scans produces a distortion-free symmetrical signal.

Scan reversal as illustrated in FIG. 4B involves controlling scan direction. In accordance with another advantageous scanning technique, referred to herein as structured scanning, scan distribution is controlled to avoid unnecessary surface charging outside selected areas of interest. "Exhaustive" raster scanning of an image field as illustrated in FIG. 5A has been described previously. In accordance with structured scanning, illustrated in FIG. 5B, only particular areas of interest are scanned, avoiding surface charging incident to the scanning of other areas. In the example of FIG. 5B, a contact hole 73 an isolated line 75 and a dense line 75 are selectively scanned. Structured scanning furthermore increases system throughput by reducing scanning time.

In order to effectively image high-aspect-ratio contact holes a scanning technique that controls both direction and distribution of scans may be used to advantage. In this technique, referred to herein as radial scanning, the particle beam is scanned along a multiplicity of radii of a contact hole or other generally circular high-aspect-ratio structure. Raster scanning of a contact hole as illustrated in FIG. 6A has been previously described. In radial scanning, illustrated in FIG. 6B, each scan line passes through the center of the contact hole. For simplicity, each scan may originate at the center of the contact hole and extend radially outward to a point beyond an edge of the contact hole. Other scanning arrangements, however, are also possible. The only requirement is that each scan include the approximate center of the contact hole. Radial scanning produces a highly advantageous charge distribution in which charge is concentrated inside the contact hole being imaged while surface charging is avoided. Because scan lines converge at the center of the contact hole and diverge with increasing distance from the center, a charge density proportional to $\frac{1}{2}\pi r$ results. The greatest charge density is in the center of the hole to facilitate imaging of the bottom of the hole.

Beginning each scan from the center of the contact hole is advantageous in that it allows a remapping operation to be performed so as to produce a display indicative of circularity and edge roughness of the contact hole. The results of such a remapping operation are illustrated in FIG. 7. Each radial scan $R_1 R_2 \ldots R_N$ is displayed in a conventional raster scan pattern with each radial scan occupying one raster. For a perfectly smooth circular contact hole, the resulting display would be a straight line. Deviations from a straight line are indicative of ellipticity and/or edge roughness.

In order to identify the center of the contact hole to perform radial scanning, conventional pattern recognition techniques known in the art may be applied to a low-magnification image including the contact hole.

FIG. 8 shows in detail the electron column of a scanning electron microscope with which the present invention may be used. The electron beam path is represented by a vertical broken line 47 and extends down to the wafer plane 43. An upper octupole assembly 49 functions to position the electron beam. An upper detector assembly 51 houses the upper detector, preferably a microchannel plane detector. A lower octupole assembly 57 functions to scan the electron beam back and forth across the surface of the wafer. The lower detector opposes the wafer surface and is preferably a microchannel plate detector.

FIG. 9 shows the complete electron optics of a scanning electron microscope with which the present invention may be used. An upper column assembly 60 houses the upper octupole, the spray aperture assembly 50 and the upper detector assembly 51 and includes an electron gun interface 46. A magnetic lens assembly 70 includes a magnetic lens pole-piece 39 and electric winding 41. Attached to the polepiece is a lens cap 71. The magnetic lens liner extends inside the magnetic lens assembly 70. Also housed inside the magnetic lens assembly 70 are the lower octupole assembly 57 and the lower detector.

The foregoing has described the principles, preferred embodiments and modes of operation of the present invention. However, the invention should not be construed as limited to the particular embodiments discussed. Instead, the above-described embodiments should be regarded as illustrative rather than restrictive, and it should be appreciated that variations may be made in the embodiments by workers skilled in the art without departing from scope of the present invention as defined by the following claims.

What is claimed is:

1. In a scanning particle beam microscope, a method of reducing signal distortion, comprising the steps of:
   scanning across an object along a line in a first direction to produce a first signal;
   scanning across said object along the identical line in an opposite, anti-parallel, direction to produce a second signal;
   combining said first and second signals so as to reduce the influence of a charging effects on a resulting combined signal.

2. In a scanning particle beam microscope, a method of inspecting a nominally circular hole in an object, comprising the steps of:
   using previously-obtained a low-magnification image of said object, identifying by pattern recognition an approximate center of said nominally circular hole;
   positioning a particle beam at said approximate center;

initially scanning said particle beam radially outward from said approximate center to a point beyond an edge of said nominally circular hole;

returning said particle beam to said approximate center;

subsequently scanning said particle beam radially outward from said approximate center in a new direction to a point beyond an edge of said nominally circular hole; and repeating a multiplicity of times said returning and subsequent scanning steps.

3. The method of claim 2 comprising producing a display indicative of circularity and edge roughness of said nominally circular hole by the further step of:

displaying results of radial scans performed in accordance with claim 2 in a conventional raster scan pattern with each radial scan occupying one raster.

4. In a scanning particle beam microscope a method of scanning features of an object comprising the steps of:

identifying by pattern recognition features of said object in a previously-obtained low magnification image; and scanning a particle beam across said object discontinuously, unblanking said particle beam except in portions of an image field containing said features.

5. In a scanning particle beam microscope, a scanning method for imaging of generally circular high-aspect-ratio structures, comprising the steps of:

generating a particle beam;

directing said particle beam onto a surface of a structure being examined;

scanning said particle beam across said surface in a raster scan pattern;

during said scanning, detecting particles emitted from said surface to generate a first detection signal;

using said first detection signal, forming an image of said surface;

performing pattern recognition on said image to identify approximately the center of the generally circular high-aspect-ratio structure;

electrostatically scanning said particle beam along a multiplicity of radii of said generally circular high-aspect-ratio structure;

during the preceding step of electrostatically scanning, detecting particles emitted from said surface to generate a second detection signal;

using said second detection signal form an image of said generally circular high-aspect-ratio structure.

6. In a scanning particle beam microscope, a scanning method for imaging of generally circular high-aspect-ratio structures, comprising the steps of:

identifying an approximate center of said generally circular high-aspect-ratio structure;

electrostatically scanning a particle beam along a multiplicity of radii of said generally circular high-aspect-ratio structure;

during the preceding step of electrostatically scanning, detecting particles emitted from a surface including said generally circular high-aspect-ratio structure to produce a detection signal; and using said detection signal to form an image of said generally circular high-aspect-ratio structure.

7. In a scanning particle beam microscope, a scanning method for minimizing baseline distortion of a detected signal, comprising the steps of:

generating a particle beam;

directing said particle beam onto a surface of a structure being examined;

scanning said particle beam across said surface in a first direction;

during said scanning, detecting particles emitted from said surface to generate a first detection signal;

scanning said particle beam in a direction opposite said first direction so as to retrace a previous scan;

detecting particles emitted from said surface to generate a second detection signal; and combining said first and second detection signals so as to reduce the influence of a charging effects on a resulting combined signal.

8. In a scanning particle beam microscope, a scanning method for minimizing baseline distortion of a detected signal, comprising the steps of:

scanning a particle beam across a surface of a structure being examined while detecting particles emitted from said surface to generate a first detection signal;

scanning said particle beam in a reverse direction across said surface while detecting particles emitted from said surface to generate a second detection signal; and combining said first and second detection signals so as to reduce the influence of a charging effects on a resulting combined signal.

* * * * *